(12) United States Patent
He et al.

(10) Patent No.: US 10,993,317 B2
(45) Date of Patent: Apr. 27, 2021

(54) WAFER LEVEL OPTICAL MODULE

(71) Applicant: Apple Inc., Cupertino, CA (US)

(72) Inventors: Yinjuan He, Cupertino, CA (US);
Karthik Shanmugam, Singapore (SG);
Peter R. Harper, Gilroy, CA (US);
Tongbi Tom Jiang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 97 days.

(21) Appl. No.: 16/375,493

(22) Filed: Apr. 4, 2019

(65) Prior Publication Data

US 2020/0107435 A1   Apr. 2, 2020

Related U.S. Application Data

(60) Provisional application No. 62/738,304, filed on Sep. 28, 2018.

(51) Int. Cl.
| | |
|---|---|
| *H05K 1/02* | (2006.01) |
| *H01L 33/24* | (2010.01) |
| *H01L 33/62* | (2010.01) |
| *H01L 33/08* | (2010.01) |
| *H01L 25/16* | (2006.01) |
| *H01L 23/31* | (2006.01) |
| *H05K 5/06* | (2006.01) |

(52) U.S. Cl.
CPC ....... *H05K 1/0274* (2013.01); *H01L 23/3107* (2013.01); *H01L 25/167* (2013.01); *H01L 33/08* (2013.01); *H01L 33/24* (2013.01); *H01L 33/62* (2013.01); *H05K 5/065* (2013.01)

(58) Field of Classification Search
CPC . H05K 1/0274; H01L 23/3107; H01L 25/167; H01L 33/08; H01L 33/24; H01L 33/62
See application file for complete search history.

(56) References Cited

U.S. PATENT DOCUMENTS

| | | | |
|---|---|---|---|
| 2013/0164867 A1* | 6/2013 | Ramasamy | ....... H01L 27/14632 438/25 |
| 2015/0137148 A1* | 5/2015 | Wong | .................... H01L 25/167 257/82 |
| 2015/0173631 A1* | 6/2015 | Richards | ............ A61B 5/02427 600/479 |
| 2015/0262983 A1* | 9/2015 | Krabe | ..................... H01L 24/20 250/214.1 |
| 2019/0137332 A1* | 5/2019 | Chu | ....................... G01J 1/0407 |
| 2019/0252312 A1* | 8/2019 | Yu | .......................... H01L 25/16 |

* cited by examiner

*Primary Examiner* — Christine A Enad
(74) *Attorney, Agent, or Firm* — Fletcher Yoder PC

(57) ABSTRACT

An optical module may be formed on a wafer. The wafer may include a substrate and one or more optical components encapsulated, at least partially, by the substrate. Each of the optical components are configured to emit or sense light. The wafer may also include one or more printed circuit board (PCB) bars encapsulated, at least partially, by the substrate allowing electrical conductivity from a first side of the substrate to a second side of the substrate. The wafer may also include at least one redistribution layer to electrically couple at least one of the optical components to at least one of the PCB bars.

20 Claims, 16 Drawing Sheets

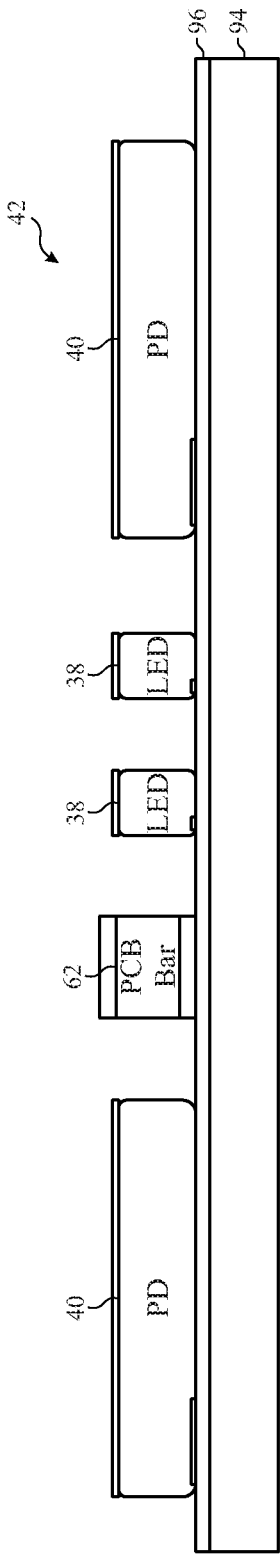
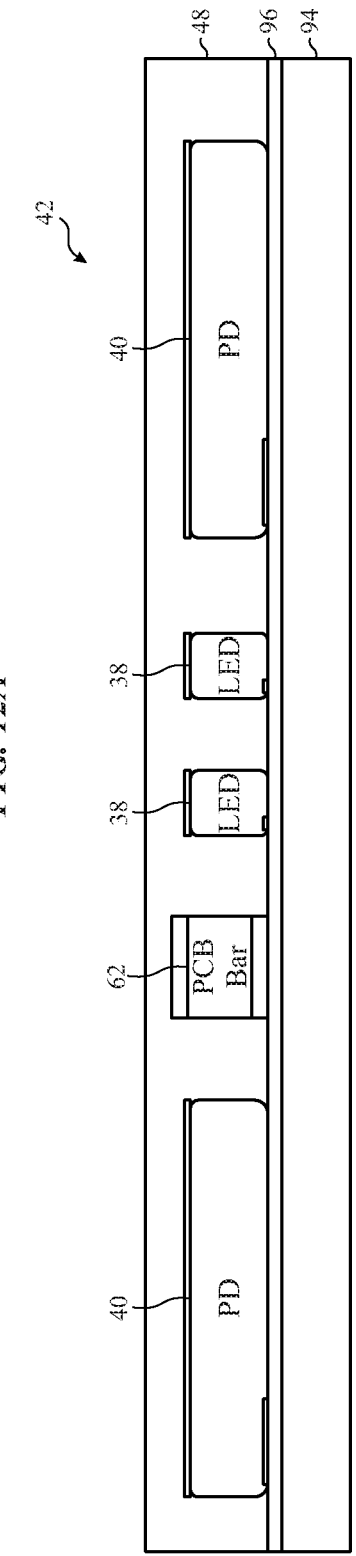
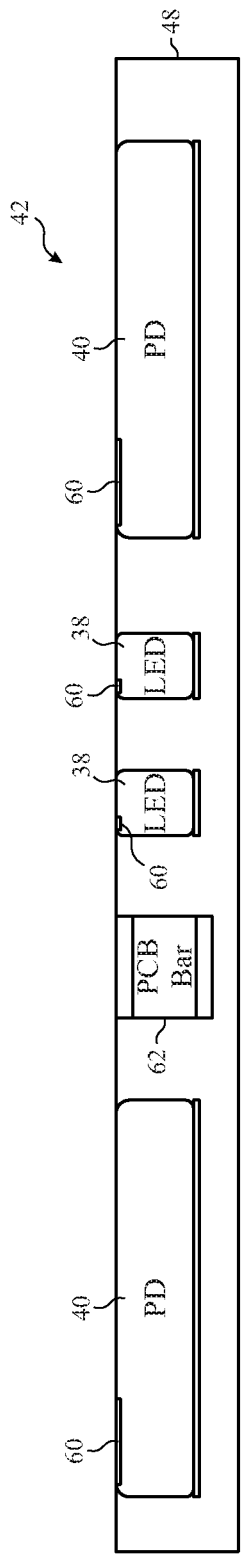

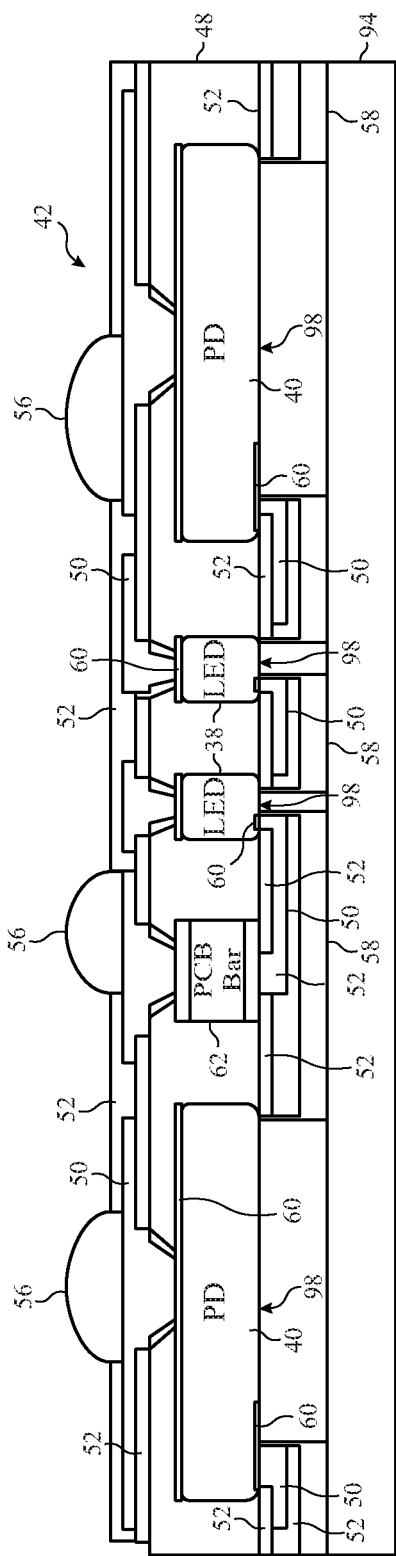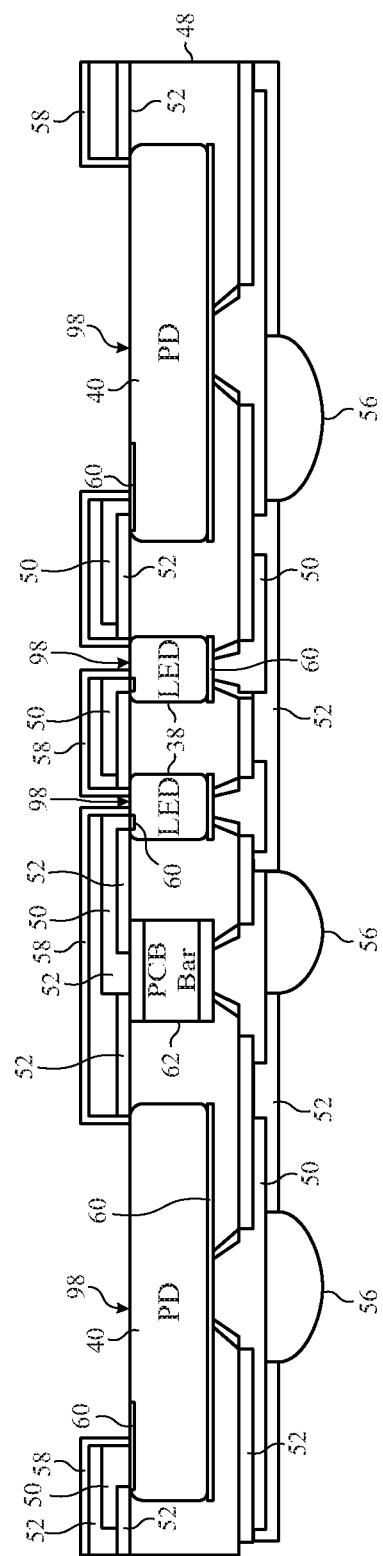

WAFER LEVEL OPTICAL MODULE

CROSS-REFERENCE TO RELATED APPLICATIONS

This application claims priority from and the benefit of U.S. Provisional Application No. 62/738,304, filed Sep. 28, 2018, entitled "WAFER LEVEL OPTICAL MODULE," which is incorporated herein by reference in its entirety.

BACKGROUND

The present disclosure relates generally to an optical module having a light source and/or a light detector integrated into a substrate (e.g., a wafer).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often optical components, such as use lights (e.g., light emitting diodes (LEDs), laser diodes (LDs), etc.) and/or light sensors (e.g., photodiodes), to assist in various tasks that may include visual effects and/or sensory processing. In some scenarios, such lights and/or light sensors may be integrated with processing and/or control circuitry, such as on a printed circuit board (PCB). Further, one or more lights and/or light sensors may be arranged on a separate PCB.

An optical module includes an arrangement of lights and/or light sensors for use as optical inputs and/or outputs for an electronic device. In general, the lights and/or light sensors are mounted on a PCB to provide appropriate electrical connections. Many optical modules use wire bonds to attach the electrical connections of the optical components to the PCB. However, such wire bonds may be susceptible to trauma (e.g. from g-force shocks, direct contact, etc.). Furthermore, wire bonds may take up additional space on the surface of the PCB limiting placement of the lights and/or light sensors as well as increasing the thickness of the overall optical module.

Additionally, some optical modules may include optical barriers to provide optical isolation between the surface-mounted lights, light sensors, and/or other components of the electronic device. Such optical barriers may further increase the thickness profile of the optical module.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

One or more light sources (e.g., light emitting diodes (LEDs), laser diodes (LDs), etc.) and/or light sensors (e.g., photodiodes), collectively referred to herein as optical components or elements, may be arranged on a substrate (e.g., a wafer) for use in an optical module. An optical module may be utilized for multiple tasks including, for example, a visual effect (e.g., indicator lights, an optical entertainment display, etc.), a proximity sensor, an ambient light sensor, a heart-rate sensor, a pulse oximetry sensor, an image sensor (e.g., a charge-coupled device (CCD)), facial recognition, etc. As will be appreciated, such embodiments are given for example, and, as such, are non-limiting.

In some embodiments, the light sources and/or light sensors may be integrated into a wafer using wafer level packaging. That is, the light source and/or light sensor optical components may be incorporated directly into the die, in contrast to surface mounting. Additionally, the integrated optical component(s) may be covered, at least partially, on both the top and bottom to allow for electrical connections and/or optical separation from other optical components. Some electrical connections (e.g., from the top of an optical component) may be routed through the wafer, for example using a printed circuit board (PCB) bar, to an external connection (e.g., surface-mount technology (SMT) pads, solder bumps, etc.) for connection to a controller and/or processor. The routing of electrical connections within the wafer allows for a fan-out of electrical connections for optimal placement of optical components in the optical module. The present disclosure relates at least to an optical module using wafer level packaging and an example process for producing it.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
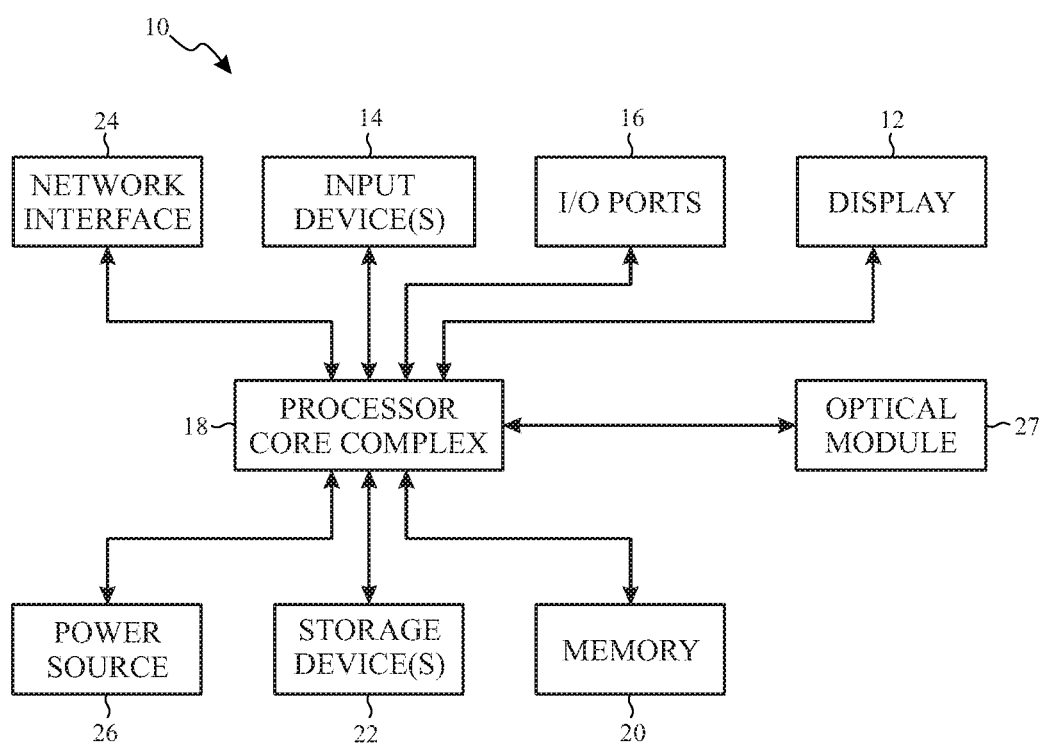
FIG. 1 is a block diagram of an electronic device that includes an optical module, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One or more lights (e.g., light emitting diodes (LEDs), laser diodes (LDs), etc.) and/or light sensors (e.g., photodiodes) may be arranged on a substrate (e.g., a wafer) for use in an optical module. An optical module may be utilized for multiple tasks including, for example, a visual effect (e.g., indicator lights, an optical entertainment display, etc.), a proximity sensor, an ambient light sensor, a heart-rate sensor, a pulse oximetry sensor, an image sensor (e.g., charge-coupled device (CCD)), a finger print scanner, facial recognition, etc. As will be appreciated, such embodiments are given for example, and, as such, are non-limiting.

As mentioned above, some optical modules may utilize surface-mounted lights and/or light sensors and use wire bonds for electrical connections to the lights and/or light sensors. However, wire bonds may be susceptible to trauma (e.g. g-force shocks, direct contact, etc.). Furthermore, wire bonds may take up additional space on the surface of the substrate limiting placement of the lights and/or light sensors as well as increasing the thickness of the overall optical module. Further, surface-mounted lights and/or light sensors may include optical barriers to provide optical isolation between the surface-mounted lights, light sensors, and/or other components of the electronic device. Such optical barriers may further increase the thickness profile of the optical module.

In the present disclosure, however, the lights and/or light sensors may be integrated into a wafer using wafer level packaging. That is, the optical components may be incorporated directly into the die, in contrast to surface mounting. Additionally, the integrated optical components may be covered, at least partially, on both the top and bottom to allow for electrical connections and/or optical separation from other optical components. In some embodiments, the surface of the cover may include a black soldermask for additional optical isolation. Depending on implementation, integration of the optical components into the wafer may provide optical isolation between the optical components without additional optical barriers that would increase the thickness of the optical module.

Additionally, the electrical connections for the optical components may also be integrated into the wafer in contrast to using wire bonding. For example, the optical components may be, at least partially covered on both the top and bottom sides, and electrical connections (e.g., from the top of an optical component) may be routed through the wafer, for example using a conductive via or a printed circuit board (PCB) bar, to an external connection (e.g., surface-mount technology (SMT) pads, solder bump, etc.). By utilizing electrical connections within the wafer, wire bonds may be eliminated.

As such, the use of a wafer level optical module may yield increased reliability and robustness, for example, due to the lack of wire bonds. Additionally, the packaged wafer may be easier to handle than an open package design. Furthermore, a wafer level optical module may have a smaller overall profile and/or have built in optical isolation between components, for example, by having recessed optical components relative to the surface of the wafer.

To help illustrate, an electronic device 10, which may include an electronic display 12, is shown in FIG. 1. As will be described in more detail below, the electronic device 10 may be any suitable electronic device 10, such as a health monitor, camera, pulse and/or oximetry sensor, ambient light sensor, facial recognition sensor, finger print scanner, etc. Further, other electronic devices 10 that may include an optical module include a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In one embodiment, the electronic device 10 may include an electronic display 12, one or more input devices 14, one or more input/output (I/O) ports 16, a processor core complex 18 having one or more processor(s) or processor cores, local memory 20, a main memory storage device 22, a network interface 24, a power source 26, and an optical module 27. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component.

As depicted, the processor core complex 18 is operably coupled with local memory 20 and the main memory storage device 22. Thus, the processor core complex 18 may execute instruction stored in local memory 20 and/or the main memory storage device 22 to perform operations, such as generating and/or transmitting image data. As such, the processor core complex 18 may include one or more general purpose microprocessors, one or more application specific integrated circuits (ASICs), one or more field programmable gate arrays (FPGAs), or any combination thereof.

In addition to instructions, the local memory 20 and/or the main memory storage device 22 may store data to be processed by the processor core complex 18. Thus, in some embodiments, the local memory 20 and/or the main memory storage device 22 may include one or more tangible, non-transitory, computer-readable mediums. For example, the local memory 20 may include random access memory (RAM) and the main memory storage device 22 may include read only memory (ROM), rewritable non-volatile memory such as flash memory, hard drives, optical discs, and/or the like.

As depicted, the processor core complex 18 is also operably coupled with the network interface 24. In some embodiments, the network interface 24 may facilitate data communication with another electronic device and/or a communication network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network.

Additionally, as depicted, the processor core complex 18 is operably coupled to the power source 26. In some embodiments, the power source 26 may provide electrical power to one or more components in the electronic device 10, such as the processor core complex 18 and/or the electronic display 12. Thus, the power source 26 may include any suitable source of energy, such as a rechargeable lithium polymer (Li-poly) battery and/or an alternating current (AC) power converter.

Furthermore, as depicted, the processor core complex 18 is operably coupled with the one or more I/O ports 16. In some embodiments, I/O ports 16 may enable the electronic device 10 to interface with other electronic devices. For example, when a portable storage device is connected, the I/O port 16 may enable the processor core complex 18 to communicate data with the portable storage device.

As depicted, the electronic device 10 is also operably coupled with the one or more input devices 14. In some embodiments, an input device 14 may facilitate user interaction with the electronic device 10, for example, by receiving user inputs. Thus, an input device 14 may include a button, a keyboard, a mouse, a trackpad, and/or the like. Additionally, in some embodiments, an input device 14 may include touch-sensing components in the electronic display 12. In such embodiments, the touch sensing components may receive user inputs by detecting occurrence and/or position of an object touching the surface of the electronic display 12. In some embodiments, the optical module 27 may be used as an input device 14. For example, the optical module 27 may be used in identifying the user (e.g., via a fingerprint scanner or facial recognition sensor), identifying a user movement, or identifying a health aspect of the user (e.g., heart rate, oxygen saturation, etc.). As should be appreciated, such instances are given as examples, and, as such, are non-limiting.

In addition to enabling user inputs, the electronic display 12 may include a display panel with one or more display pixels. The electronic display 12 may control light emission from its display pixels to present visual representations of information, such as a graphical user interface (GUI) of an operating system, an application interface, a still image, or video content, by displaying frames based at least in part on corresponding image data (e.g., image pixel data located at individual pixel positions).

As depicted, the electronic display 12 is operably coupled to the processor core complex 18. In this manner, the electronic display 12 may display images based at least in part on image data received from an image data source, such as the processor core complex 18. Additionally or alternatively, the electronic display 12 may display images based at least in part on image data received via the network interface 24, an input device 14, and/or an I/O port 16.

Figure 2:
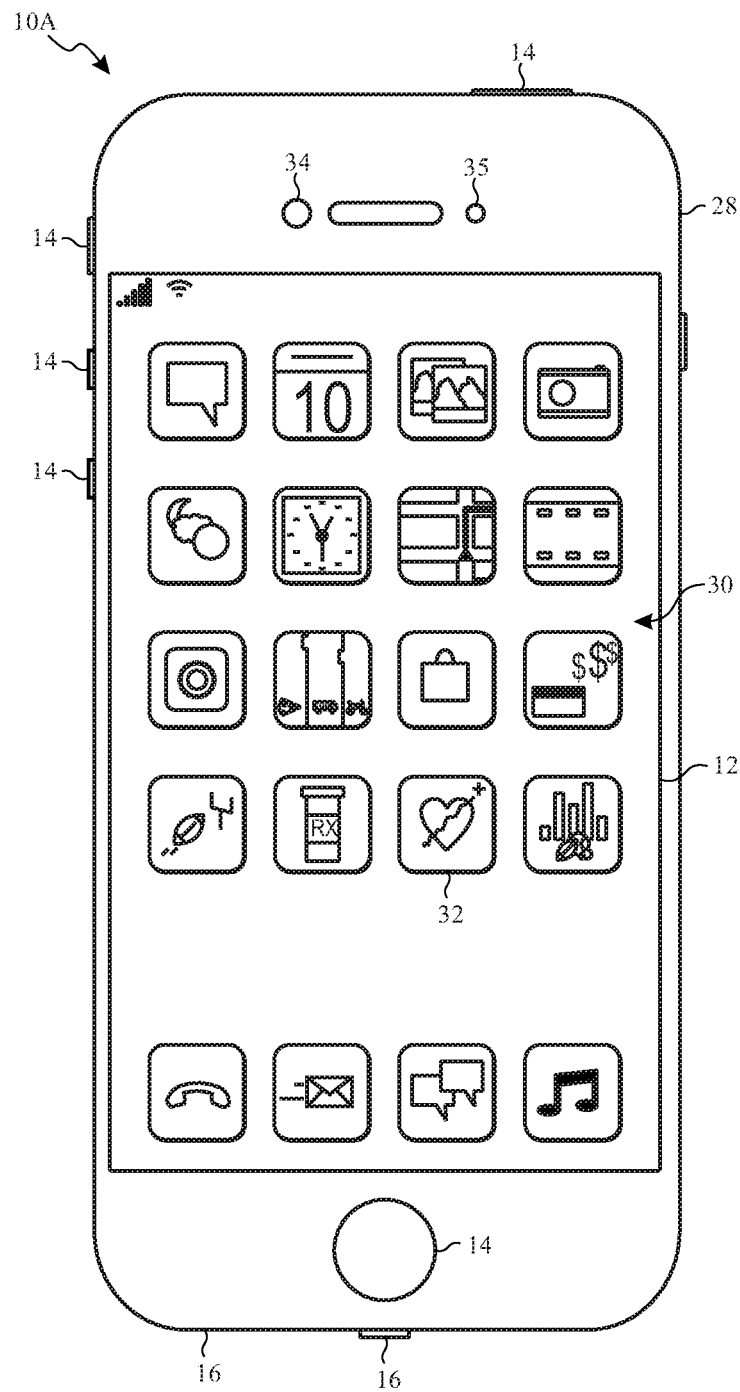
FIG. 2 is an example of the electronic device of FIG. 1, in accordance with an embodiment.

As described above, the electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For illustrative purposes, the handheld device 10A may be a smart phone, such as any iPhone® model available from Apple Inc.

As depicted, the handheld device 10A includes an enclosure 28 (e.g., housing). In some embodiments, the enclosure 28 may protect interior components from physical damage and/or shield them from electromagnetic interference. Additionally, as depicted, the enclosure may 28 surround the electronic display 12. In the depicted embodiment, the electronic display 12 is displaying a graphical user interface (GUI) 30 having an array of icons 32. By way of example, when an icon 32 is selected either by an input device 14 or a touch-sensing component of the electronic display 12, an application program may launch.

Furthermore, as depicted, input devices 14 may be accessed through openings in the enclosure 28. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. As depicted, the I/O ports 16 may be accessed through openings in the enclosure 28. In some embodiments, the I/O ports 16 may include, for example, an audio jack to connect to external devices. Additionally or alternatively to being used as an input device 14, an optical module 27 may also be utilized in a handheld device 10A for use as or with a camera 34 and/or an ambient light sensor 35. The camera 34 may use the optical module 27 during image capture or to help identify optimal image capture settings by detecting the surrounding environment. Additionally, the ambient light sensor 35, which may also use an optical module 27, may assist in determining the ambient light intensity. Such a measurement may be used for example in adjusting lighting effects of the camera 34, a backlight of the electronic display 12, or other component of the handheld device 10A.

Figure 3:
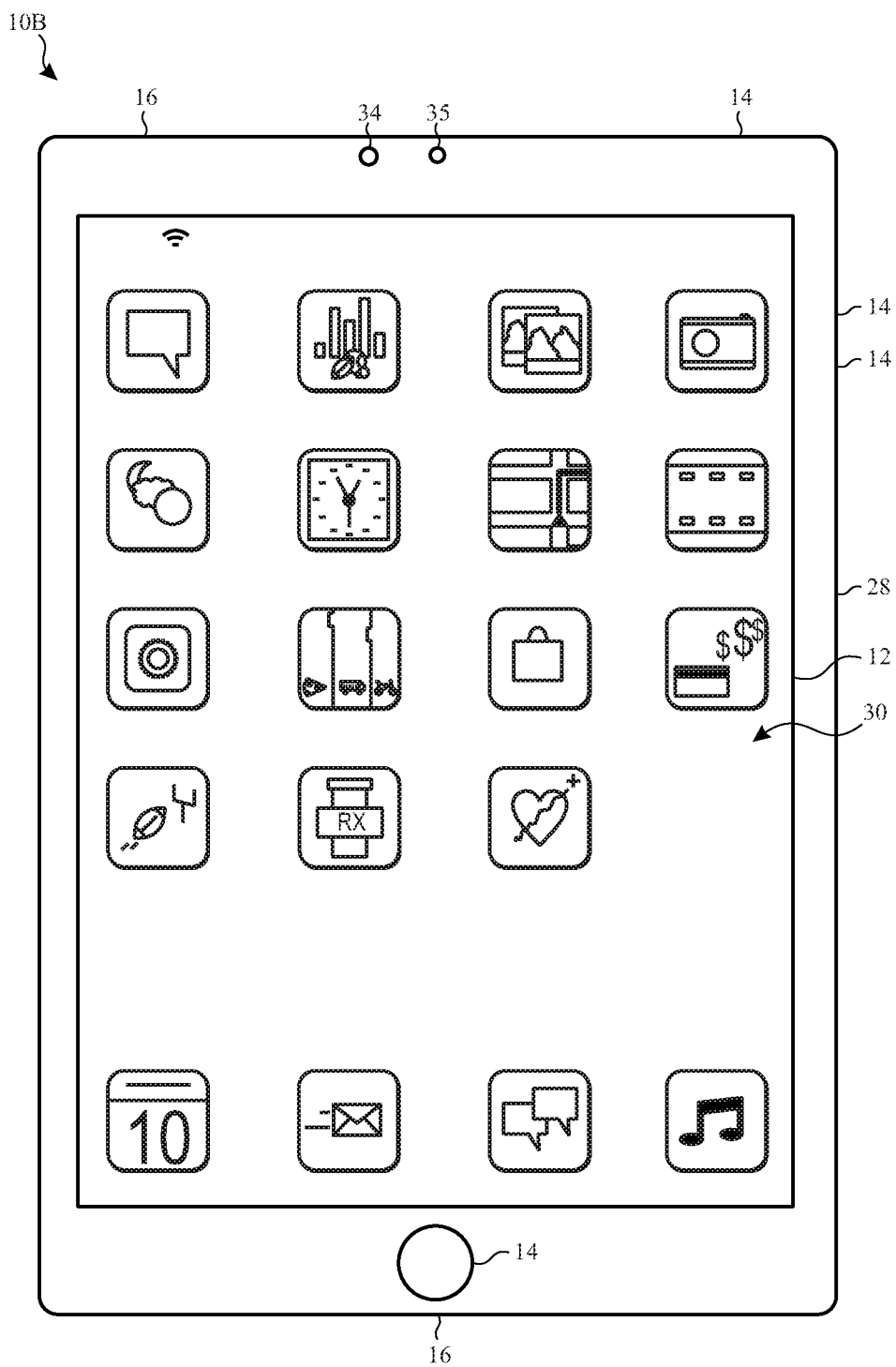
FIG. 3 is another example of the electronic device of FIG. 1, in accordance with an embodiment.
Figure 4:
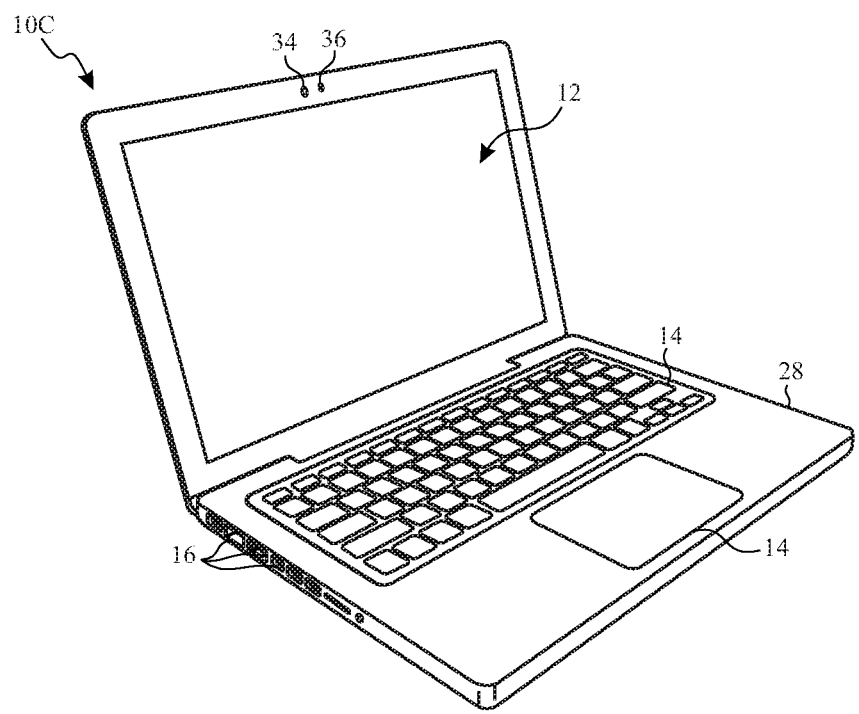
FIG. 4 is another example of the electronic device of FIG. 1, in accordance with an embodiment.

To further illustrate, another example of a suitable electronic device 10, specifically a tablet device 10B, is shown in FIG. 3. For illustrative purposes, the tablet device 10B may be any iPad® model available from Apple Inc. A further example of a suitable electronic device 10, specifically a computer 10C, is shown in FIG. 4. For illustrative purposes, the computer 10C may be any Macbook® or iMac® model available from Apple Inc.

Figure 5:
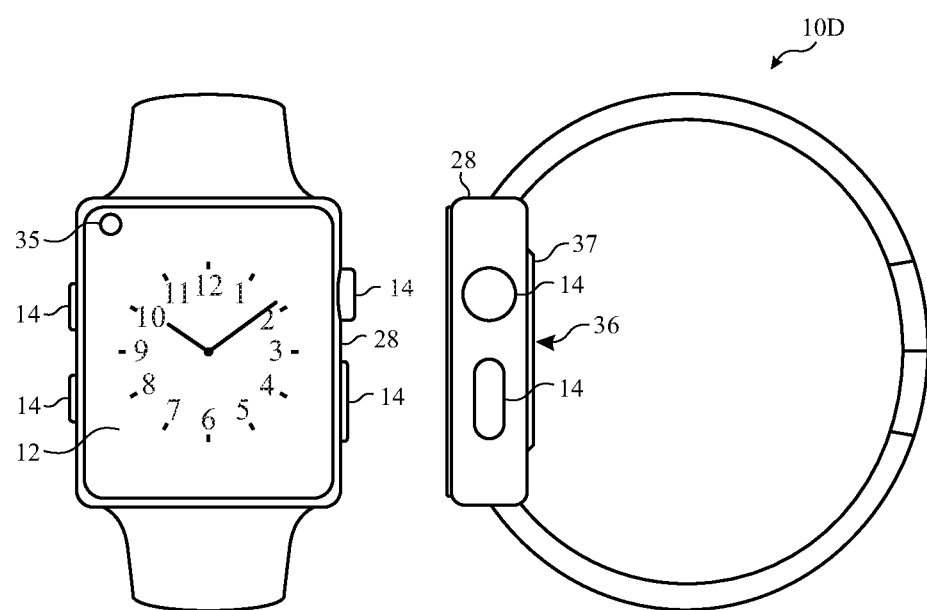
FIG. 5 is another example of a wearable version of the electronic device of FIG. 1, in accordance with an embodiment.

Another example of a suitable electronic device 10, specifically a wearable device 10D (e.g., a watch, health monitor, etc.), is shown in FIG. 5. For illustrative purposes, the wearable device 10D may be an Apple Watch® available from Apple Inc. As with the other electronic devices 10, the wearable device 10D may include an ambient light sensor 35 having an optical module 27, for example to adjust the brightness of the electronic display 12. Additionally or alternatively, the wearable device 10D may include an optical module 27 implemented as or within a health sensor 36. In some embodiments, the health sensor 36 may detect a user's heart rate, blood pressure, oxygen saturation, and/or other parameters corresponding to the user. In some embodiments, the optical module 27 may shine one or more lights onto the user and detect a light response associated with one or more health parameters of the user.

A transparent backing 37 (e.g., crystal, glass, plastic, etc.) may help facilitate optical transmissions between the optical module 27 and the user (e.g., the user's skin) as well as protect the optical module 27 and/or other components of the wearable device 10D from outside elements and/or trauma. Additionally, as mentioned above, an optical module 27 utilizing wafer level packaging, as opposed to surface mounting, may have a thinner profile. As such, the wearable device 10D may also benefit from a smaller (e.g., thinner) profile.

Figure 6A:
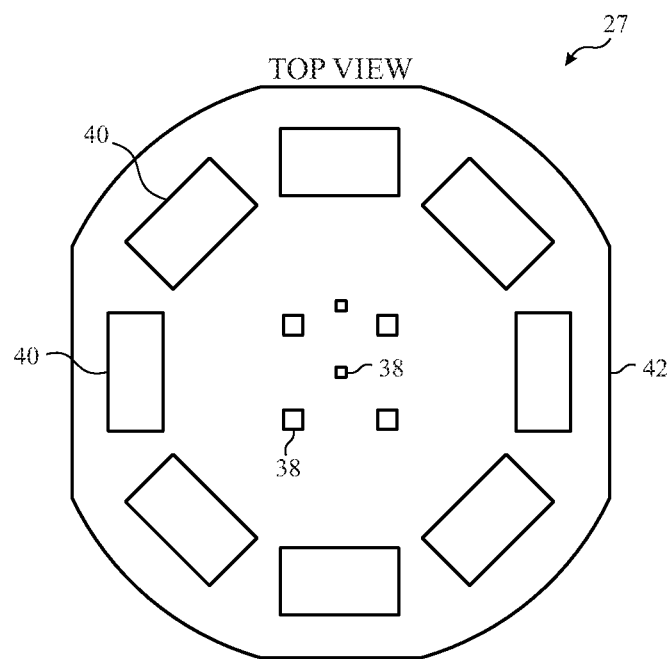
FIG. 6A is a top view of an example wafer level packaged optical module, in accordance with an embodiment.
Figure 6B:
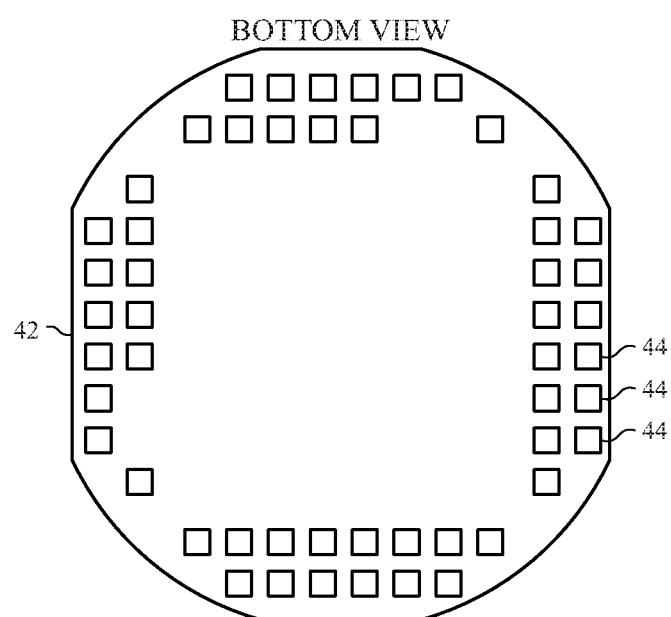
FIG. 6B is a bottom view of an example wafer level packaged optical module, in accordance with an embodiment.

FIG. 6A illustrates an example optical module 27 shown from a top view, and FIG. 6B illustrates the optical modules 27 from a bottom view. As stated above, an optical module 27 may include one or more optical components such as LEDs 38 and/or photodiodes 40 integrated into a wafer 42. As should be appreciated, other types of light emitting components (e.g., laser diodes, electroluminescent materials, etc.) and photodetectors (e.g., photodiode 40, a light emitting and absorbing diode (LEAD), etc.) may also be used. Additionally, the optical components may emit or be sensitive to light of any suitable wavelength (e.g., infrared, ultraviolet, or visible light) depending on implementation. For example, the LEDs 38 may emit visible (e.g., red, green, and/or blue light), ultraviolet, or infrared light or a combination thereof. Further, multiple different LEDs 38 may be incorporated into the optical module 27.

Depending on implementation, the optical components may work in parallel, for example, emitting light onto a subject and sensing a light response (e.g., a light refraction, reflection, and/or emission), such as in a health sensor 36. In one embodiment, the optical module 27 may include four green and two infrared LEDs 38, for example, for use in a health sensor 36. In some embodiments, green LEDs 38 may be used for sensing heart rate due to high signal-to-noise ratios, resistance to motion artifacts, and/or high absorption rate in hemoglobin. Additionally, red and/or infrared lights may be used for deeper detections into a user's skin, as red and infrared light are not as readily absorbed, and, thus, penetrate deeper into the skin, as is well known in the art of pulse oximetry for example. Additionally or alternatively, the optical components may be used separately, for example, to illuminate a subject for a user for viewing or to sense ambient light not associated with the optical module 27, for example to adjust the brightness of an electronic display 12.

In some embodiments, the layout of the optical components in the wafer 42 may include multiple (e.g., 2, 4, 5, 8, 14, etc.) photodiodes 40 generally surrounding one or more LEDs 38 so that an optical barrier may be created between the photodiodes 40 and the LEDs 38. The optical barrier prevents light from the LEDs 38 from directly impacting the photodiodes 40. Multiple LEDs 38 may be used to provide different wavelengths of light emission and/or to increase the light output intensity. Similarly, multiple photodiodes 40 may be used to detect light of particular wavelengths and/or to increase the light sensitivity of the optical module 27. As should be appreciated, other optical component layouts may also be used based on implementation. The layout of external connections 44 of the optical components may also be arranged according to implementation, and, in one embodiment, may include external connections 44 on a single side (e.g., the bottom) and may be situated along an outer edge of the wafer 42 for ease of connecting the optical module 27 to processor core complex 18 or other component of the electronic device 10. Although depicted as square, the external connections 44 may include other shapes (e.g., round) depending on implementation.

Figure 7:
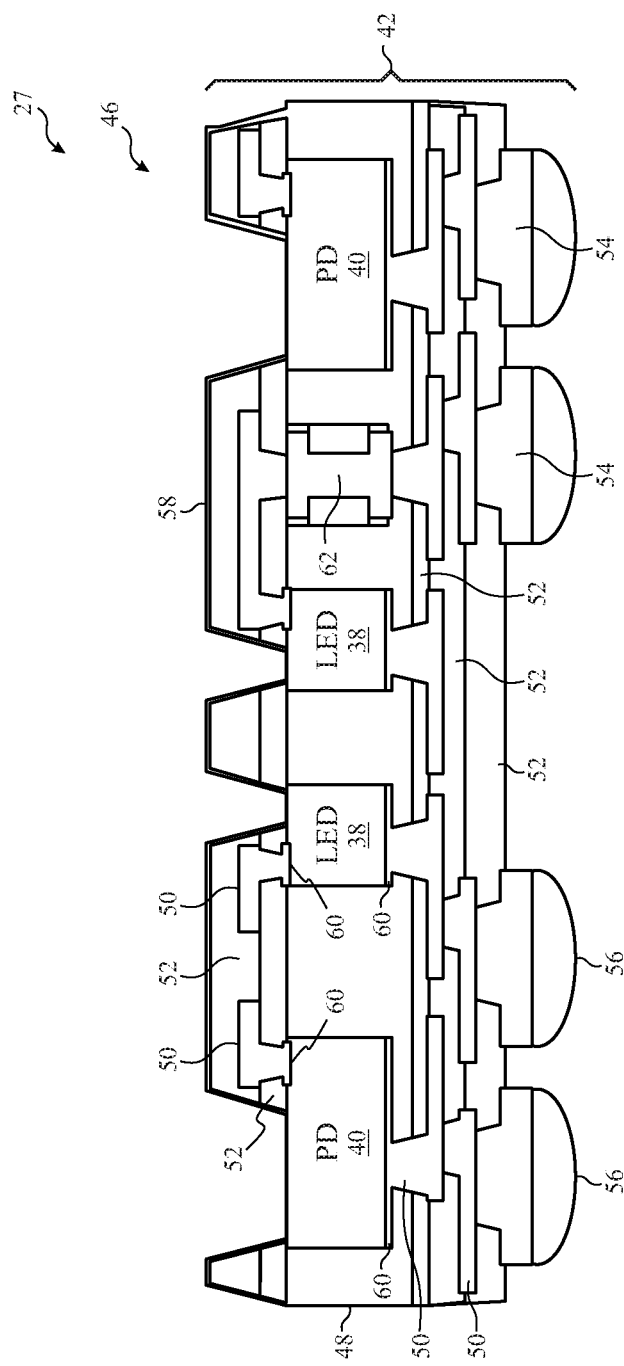
FIG. 7 is a cross sectional view of the wafer level packaged optical module of FIG. 6, in accordance with an embodiment.

FIG. 7 is a cross sectional view 46 of an example optical module 27 having multiple optical components (e.g., LEDs 38 and photodiodes 40). The optical components may be held in the substrate mold 48 of the wafer 42 with one or more of multiple layers (e.g., a redistribution layer (RDL) 50, a passivation layer (PSV) 52, an under-bump metallization (UBM) layer 54, solder bumps 56, a photoresist layer 58, etc.) on respective sides of the substrate mold 48. In some embodiments, the wafer 42 may be approximately 300 micrometers (μm) thick. Depending on implementation, the wafer thickness may vary (e.g., less than 200 less than 350 less than 500 less than 1 millimeter (mm), or greater than 1 mm).

An RDL 50 may be made of any suitable conductive material (e.g., copper, gold, etc.), and may be used to connect and/or route electrical connections 60 of the optical components to the external connections 44 of the optical module 27. For example, spacing, layout, and/or orientation may make it impractical to provide an external connection 44 (e.g., a UBM layer 54 and/or solder bump 56) directly beneath (e.g., relative to FIG. 7) each electrical connection 60. As such, the RDL 50 may route the electrical connection 60 of an optical component to another portion of the wafer 42 before connecting to an external connection 44. The RDL 50 may also be used to organize the external connections 44, for example, based on implementation.

PSVs 52 may be layered on either side of an RDL 50 to provide a coating of metal oxide to help reduce the chance of corrosion and/or to provide electrical isolation between RDLs 50 and electrical connections 60. PSVs 52 may be made of any suitable passivation material (e.g., hexadecanethiol (HDT) or any other suitable dielectric material). Additionally, a dark photoresist layer 58 (e.g., a black soldermask) may be coated on top of the top-most PSV 52 (e.g., around the LEDs 38 and/or photodiodes 40) to reduce or eliminate direct optical communication between the optical components. For example, in some embodiments, it may be desirable to avoid direct optical communication between at least some of the LEDs 38 and the photodiodes 40 to allow for the photodiodes 40 to better distinguish light and/or responses external to the optical module 27 (e.g., from a user's skin). As such, the photoresist layer 58 may help reduce internal reflection and/or refraction between the LEDs 38 and the photodiodes 40. In some embodiments, deposited layers such as substrate, an RDL 50, and/or a PSV 52 may recess the active area of the optical components to further optically isolate the optical components. Further, in some embodiments, the photodiodes 40 may be optically isolated, at least partially, from direct optical communication with both the LEDs 38 and ambient light, operatively receiving, in the majority, light responses from a user.

In some embodiments, the optical components may have electrical connections 60 on the top (e.g., active side of the optical component). To allow electrical communication between the top-side electrical connection 60 and external connections 44 on the bottom of the wafer 42, an RDL 50 may route the electrical connection 60 to a printed circuit board (PCB) bar 62. The PCB bar 62 provides a conductive path through the substrate mold 48. The use of such PCB bars 62 may decrease manufacturing costs and/or time by simplifying the manufacturing process. For example, instead of drilling or etching a hole in the substrate mold 48 to create a conductive channel, a PCB bar 62 may be placed with the optical components for the substrate mold 48 to be built around them. An RDL 50 may connect the top-side electrical connection of an optical component to a PCB bar 62 allowing the electrical connections 60 as well as the optical component to beneath the surface of the wafer 42. Furthermore, as stated above, it may not be practical to provide an external connection 44 (e.g., a UBM layer 54 and/or solder bump 56) directly beneath each electrical connection 60. Similarly, it may not be practical and/or desirable to provide an external connection 44 directly beneath a PCB bar 62. As such, an RDL 50 may also route a connection from the PCB bar 62 to an external connection 44. In some embodiments, there may be one or more RDLs 50 on either side of the optical components and PCB bars 62 routing the electrical connections 60.

Figure 8:
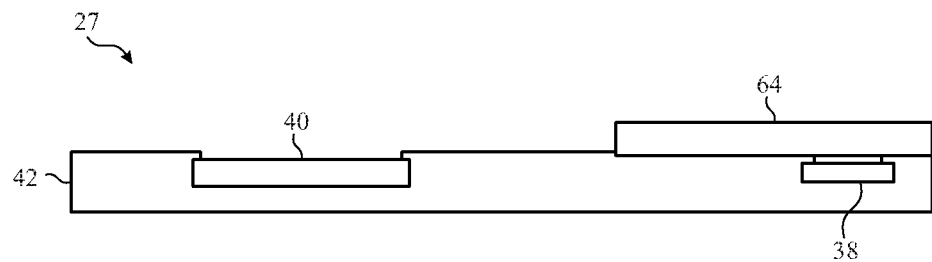
FIG. 8 is an example optical module incorporating a lens, in accordance with an embodiment.
Figure 9:
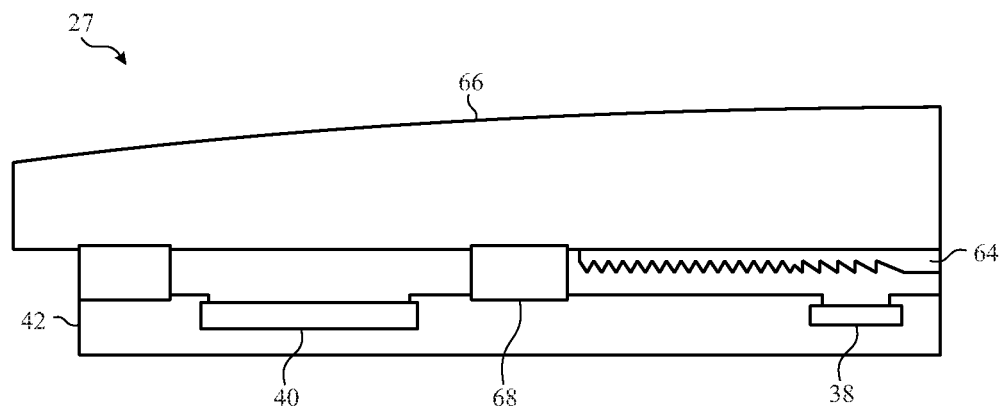
FIG. 9 is an example optical module incorporating a cover, such as a crystal, in accordance with an embodiment.

Additionally, when implemented in an electronic device 10, the optical module 27 may incorporate one or more lenses 64 and/or covers 66 as shown in FIGS. 8 and 9. In some embodiments, a lens 64 may assist in focusing the light input and/or output of one or more of the optical components. The lens 64 may be of any suitable type such as a simple lens, compound lens, lenticular lens, Fresnel lens, etc. In some embodiments, a Fresnel lens may yield increased focus while maintaining a small form factor. Additionally or alternatively, a diffuser (not shown) may be implemented to scatter light emitted or received by one or more of the optical components. Further, a lens 64 or diffuser may be positioned directly on the surface of the wafer 42, or it may be attached or integrated into a cover 66.

A cover 66 may be placed over the optical components to protect them from the elements such as dust and moisture as well as finger prints and trauma. To allow light through the cover 66, the cover 66 may be transparent, semi-transparent, and/or transparent to light of at least some wavelengths to which the optical module 27 is sensitive. For example, the cover 66 may be a transparent backing 37 (e.g., a crystal, sapphire, glass, or plastic backing) to a wearable device 10D. In some embodiments, the cover 66 may also provide a means for mounting the wafer 42 to the electronic device 10 by being attached to the enclosure 28 of the electronic device 10. For example, a spacer 68 may adhere to both the cover 66 and the surface of the wafer 42 and hold the wafer 42 in a fixed location relative to an enclosure 28 of the electronic device 10.

Figure 10:
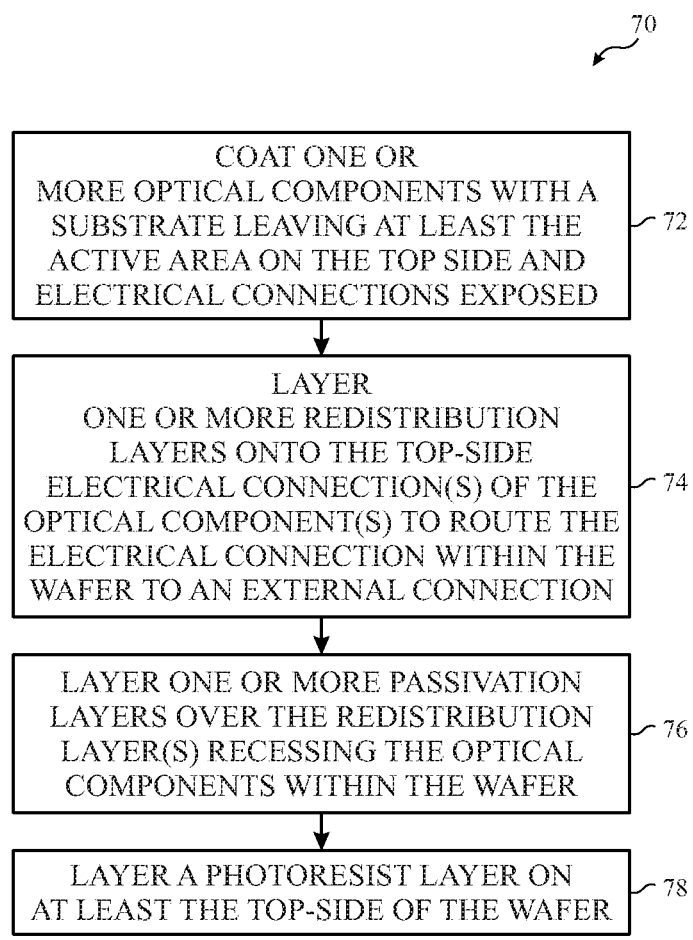
FIG. 10 is a flowchart of a process for forming a wafer, in accordance with an embodiment.

FIG. 10 is a flowchart 70 of an example overview for manufacturing an optical module 27. One or more optical components may be coated with a substrate leaving at least the active area and electrical connections of the optical component (e.g., on the top-side of the substrate) exposed (process block 72). As described in further detail below, one or more layers of different materials may then be built around the optical components to form the wafer 42. For example one or more RDLs 50 may be layered onto the top-side electrical connection 60 of each of the optical components to route the electrical connection 60 within the wafer 42 to an external connection 44 (process block 74). The molding and/or layering of materials may be accomplished by any suitable process (e.g., deposition, painting, spraying, dipping, etc.). Additionally, excess material may be removed by any suitable process (e.g., stripping, etching, buffing, drilling, grinding, ablation, etc.). Further, in some embodiments, the desired layer (e.g., a PSV 52, RDL 50, substrate mold 48, photoresist layer 58, etc.) may be placed just in desired locations, for example, using a stencil or mask. One or more PSVs 52 may also be layered over the RDLs 50, for example to recess the optical components within the wafer 42 and/or to provide electrical insulation (process block 76). Additionally, a dark photoresist layer 58 (e.g., a black soldermask) may be layered onto the top-side of the wafer 42, for example on the PSV 52 (process block 78). As mentioned above, the photoresist layer 58 may assist in optically isolating the optical components from one another and/or from ambient light.

Figure 11:
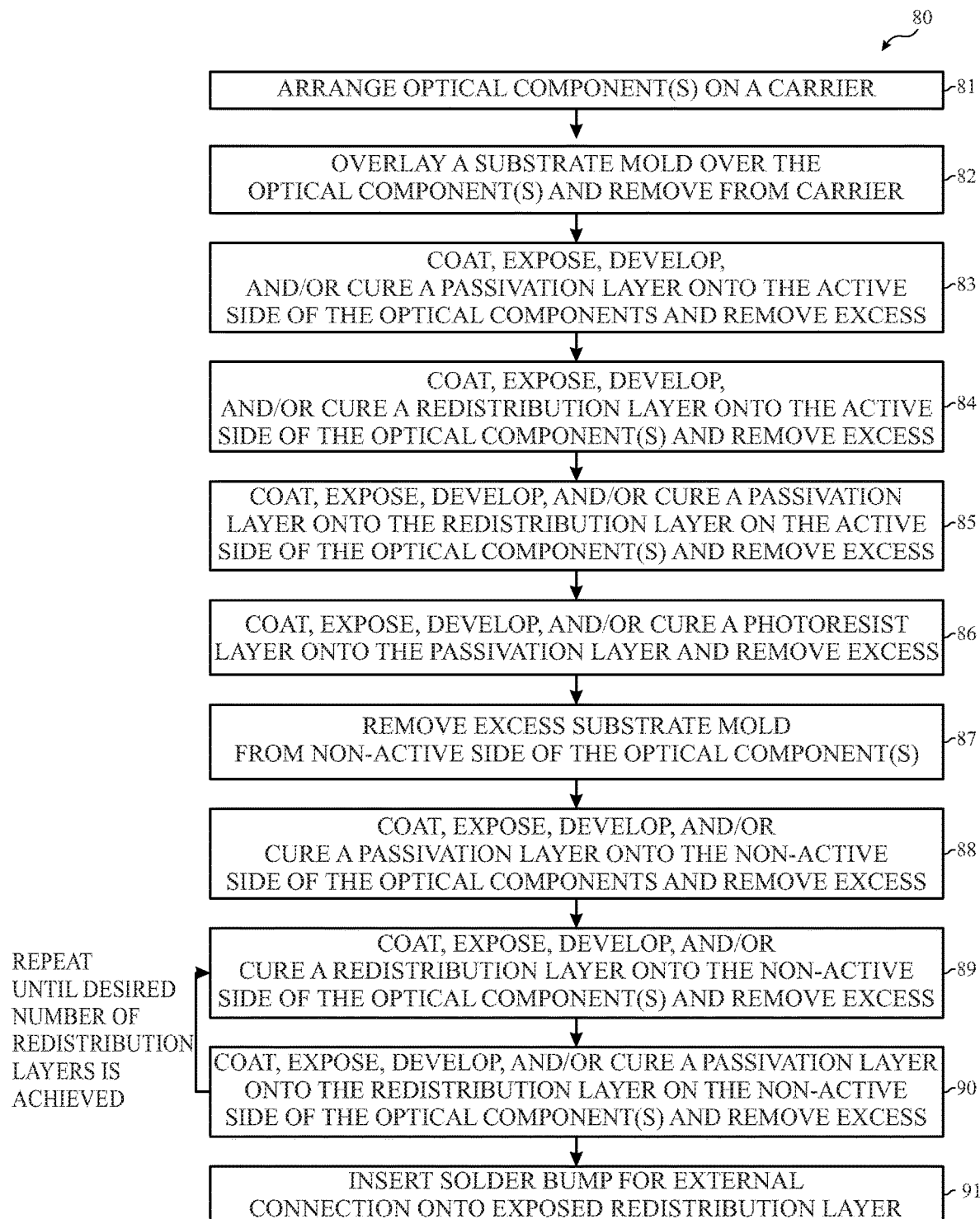
FIG. 11 is a flowchart of a process for incorporating optical components into a wafer, in accordance with an embodiment.

FIG. 11 is a flowchart 80 of an example process for manufacturing an optical module 27. In some embodiments, the optical components and/or PCB bars may first be arranged onto a carrier (process block 81). Such arrangement may be done, for example, by a pick-and-place process such that the optical components are face down (e.g., active side facing the carrier). In some embodiments using a pick-and-place process may improve manufacturing yields, as "known good" components can be selected individually for use in an optical module 27, increasing manufacturing efficiency. Furthermore, any suitable carrier (e.g., a stainless steel carrier) may be used. After placing the optical components and/or PCB bars 62 on the carrier, a substrate mold 48 may be overlaid upon the arranged optical components and/or the PCB bars to form a wafer 42, and then be removed from the carrier (process block 82). The wafer 42 may be flipped over and a first PSV 52 may be layered (e.g., coated, exposed, developed, and/or cured) onto the active side of the optical components, and any excess PSV material may also be removed (process block 83). An RDL 50 may be layered onto the first PSV 52 (process block 84) followed by a second PSV 52, and any excess material removed (process block 85). Additionally, a photoresist layer 58 may be added to the uppermost PSV 52, and any excess removed (process block 86). As should be appreciated, material added to the active side of the optical components may be layered and/or removed such that the light conducting zone of each optical component is exposed and the electrical connections 60 are connected to an RDL 50.

Excess substrate mold 48 may also be removed from the non-active side of the wafer 42 (process block 87), for example to expose contacts of the optical components and/or PCB bars 62. A first PSV 52 may be layered onto the non-active side of the wafer 42 and the excess removed (process block 88). Additionally, an RDL 50 may be layered onto the first PSV 52 (process block 89) followed by a second PSV 52, and any excess material removed (process block 90). Multiple RDL 50 and PSV 52 may be layered into the wafer 42, depending on implementation. Solder bumps 56 for an external connection 44 may be inserted onto the exposed RDL 50 (process block 91). In some embodiments, a UBM layer 54 may be used between the RDL 50 and the solder bump 56.

As mentioned above, upon completion, the wafer 42 may have a profile of less than 500 μm (e.g., less than 350 μm, 300 μm, or 200 μm) thick. Larger profile wafers 42 (e.g., having profiles greater than 500 μm or 1 mm) may also be created depending on implementation and choice of optical components. Additionally, in some embodiments, multiple wafers 42 may be prepared simultaneously to further increase manufacturing yield and efficiency. For example, in one embodiment, an 8 inch square or diameter carrier may hold multiple sets of optical components while layers are built around them. As such, a sheet of wafers 42 may be diced into multiple individual wafers 42.

Figure 12D:
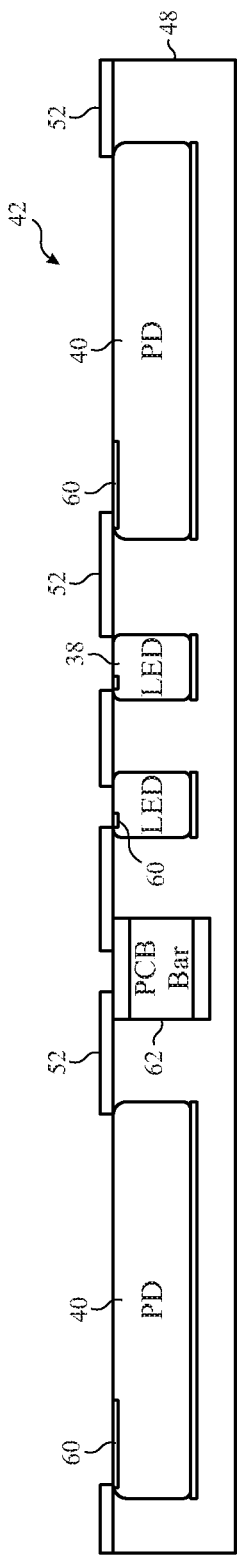
FIGS. 12A-12O are depictions of steps for incorporating optical components into a wafer, in accordance with an embodiment.
Figure 12E:
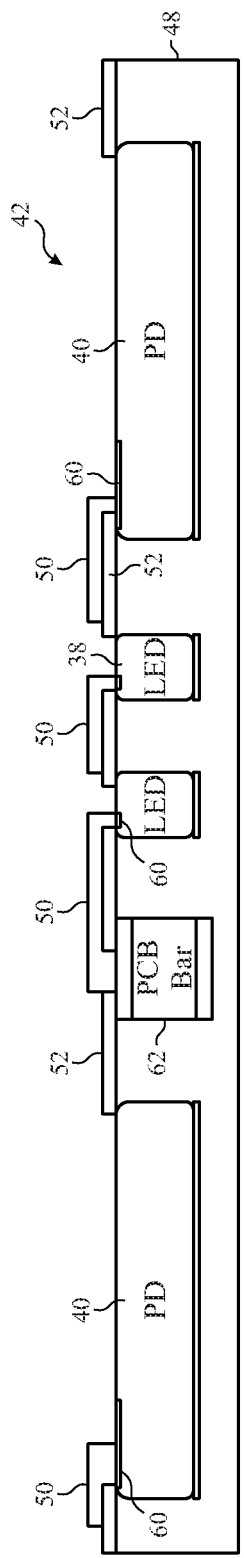
Figure 12F:
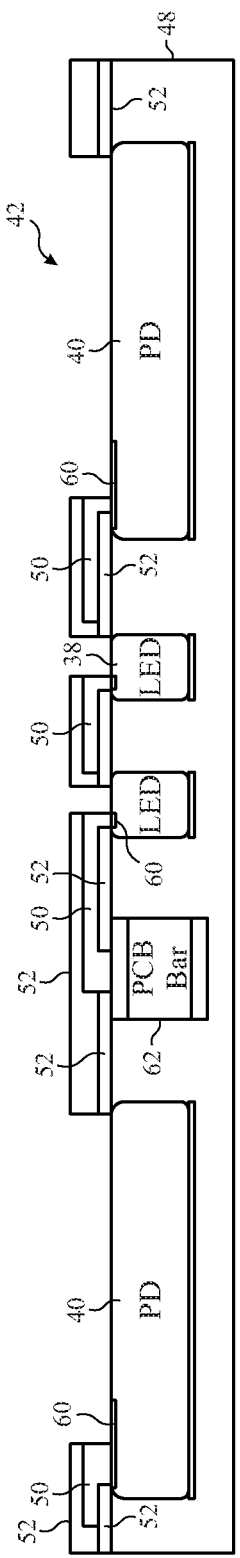
Figure 12G:
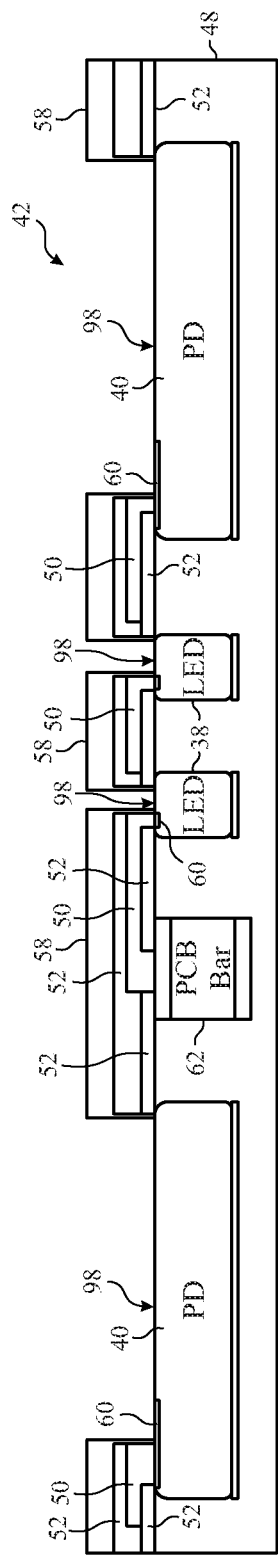

To help illustrate, FIGS. 12A-12O depict example steps for manufacturing an optical module 27. FIG. 12A illustrates multiple optical components (e.g., LEDs 38 and photodiodes 40) and a PCB bar 62 placed onto a carrier 94. In some embodiments, an adhesive 96 (e.g., double-sided tape, glue, etc.) may be implemented to keep the optical components and PCB bars 62 in place. FIG. 12B illustrates the overlay of a substrate mold 48 to encompass the optical components and PCB bars 62 to generate the beginning of the wafer 42. FIG. 12C shows a flipped wafer 42, relative to FIG. 12B, with the carrier 94 removed. FIG. 12D shows a first PSV 52 layered onto the active side of the wafer 42 while not covering the electrical connections 60 of the optical components or the PCB bar 62. FIG. 12E depicts an RDL 50 layered onto the PSV 52 and electrically connecting each top electrical connection 60 of the optical components to a PCB bar 62. FIG. 12F illustrates a second PSV 52 layered onto the first PSV 52 and the RDL 50. FIG. 12G illustrates a photoresist layer 58 coated onto the surface of the active side of the wafer 42. As stated above, the multiple layers on the active side of the wafer 42 leave exposed at least a portion of a light conducting zone 98 of the optical components.

Figure 12H:
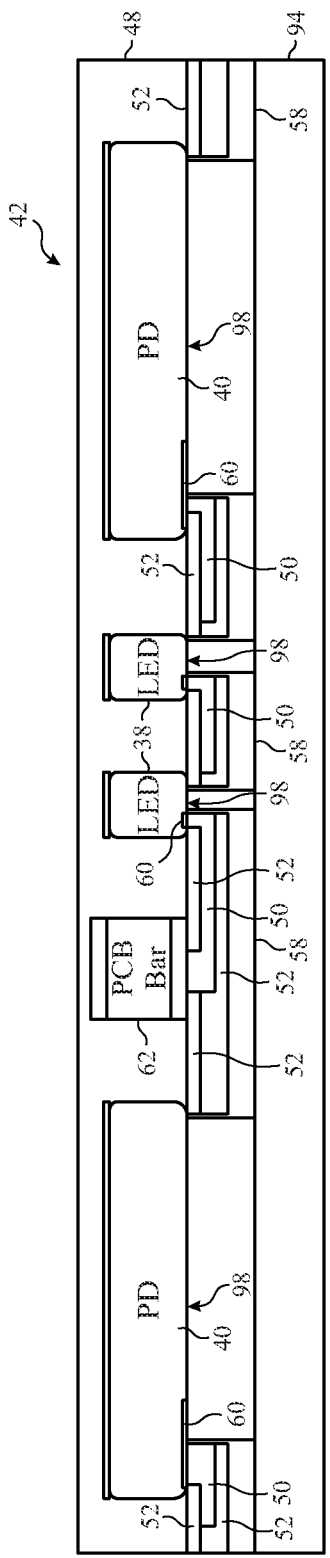
Figure 12I:
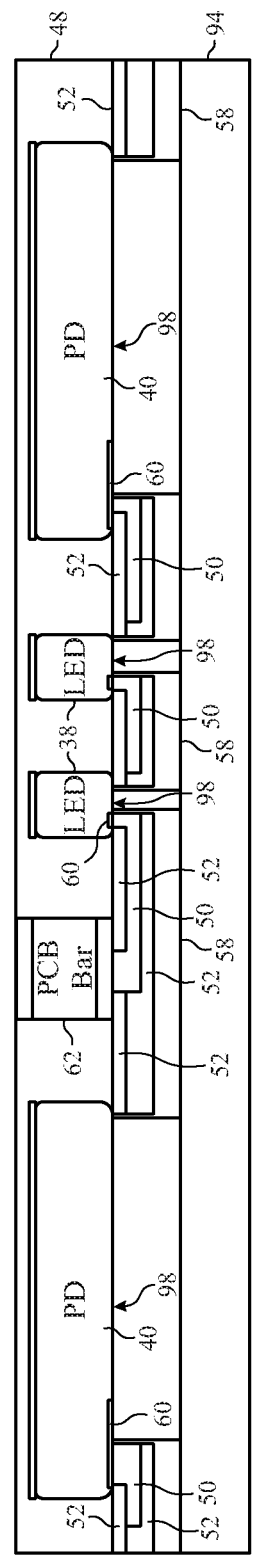
Figure 12J:
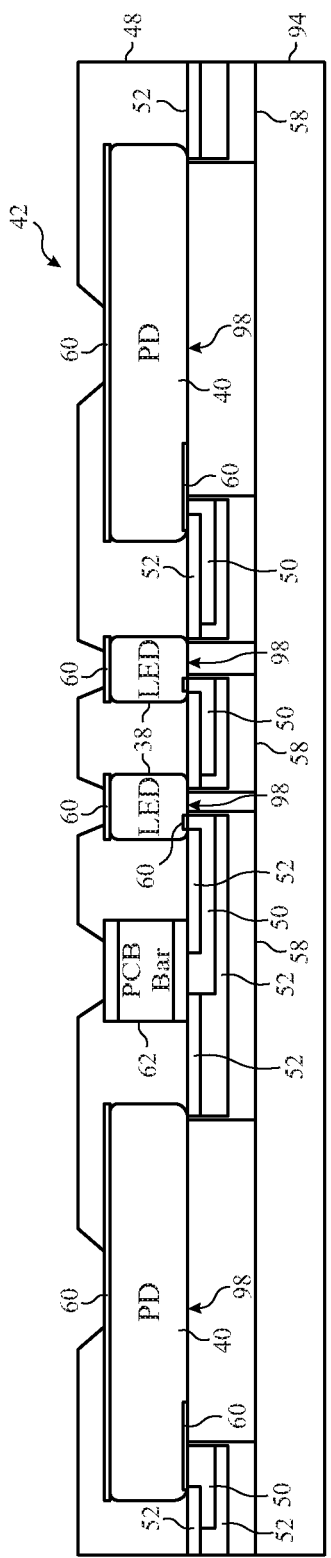
Figure 12K:
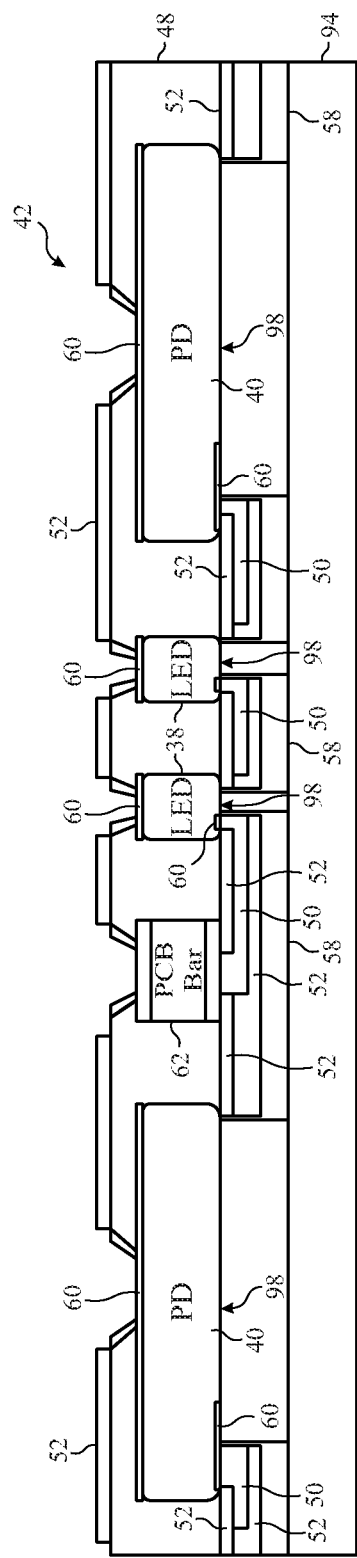
Figure 12L:
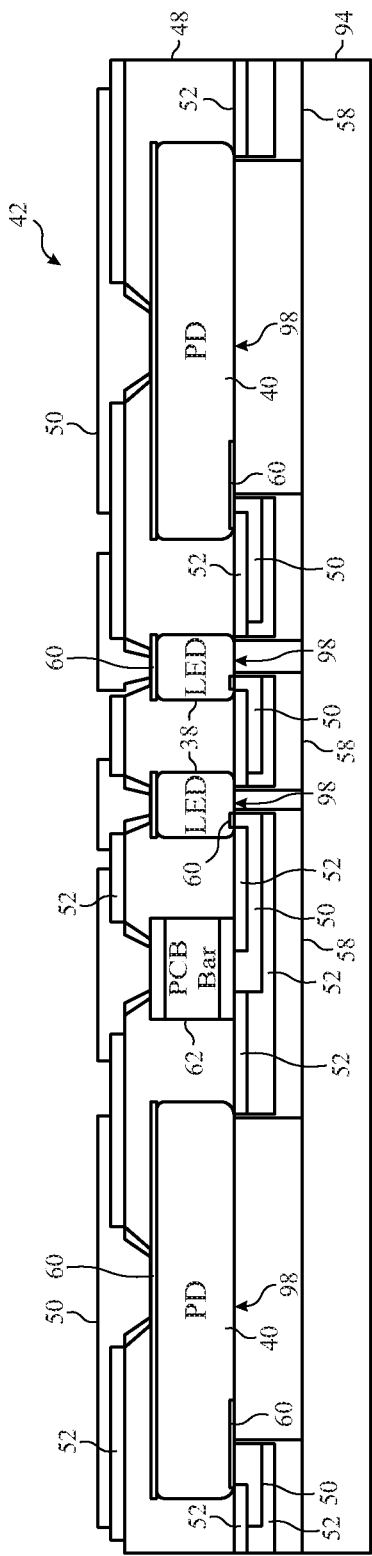
Figure 12M:
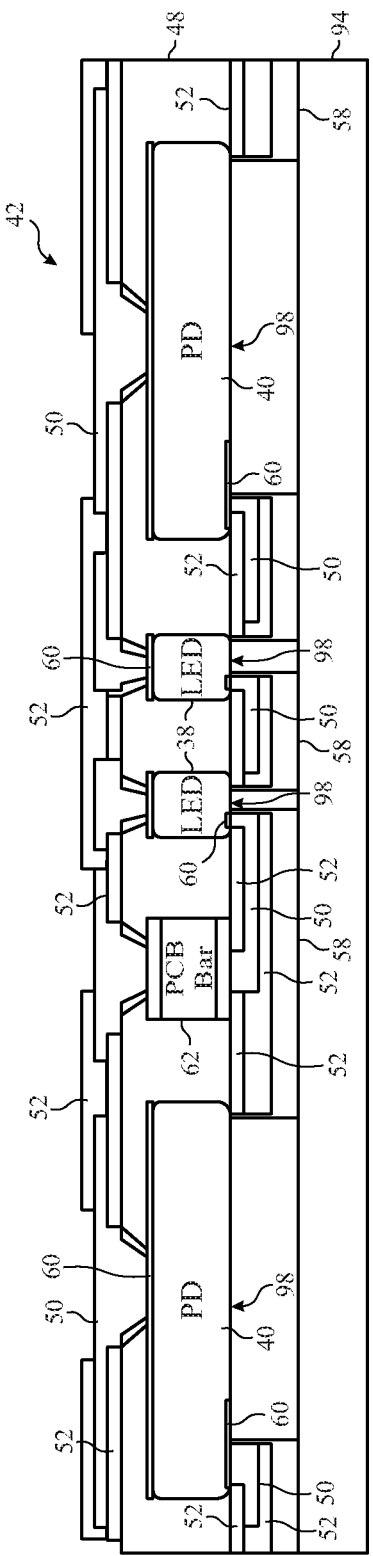

FIG. 12H depicts the wafer 42 flipped over relative to FIG. 12G, exposing the bottom of the wafer 42 and the substrate mold 48. FIGS. 12I and 12J show the removal of at least some of the substrate mold 48 to expose the bottom-side electrical connections 60 of the optical components and the PCB bar 62. FIG. 12K depicts a first PSV 52 layered to the bottom of the substrate mold 48 while maintaining access to the electrical connections 60. FIG. 12L depicts a first RDL 50 layered to connect to the electrical connections 60. FIG. 12M illustrates a second PSV 52 layered on top of the first RDL 50 and PSV 52. As stated above, multiple RDLs 50 and PSVs 52 may be layered for additional routing of electrical connections. When layering is complete, a solder bump 56 may be added to the RDL 50 to make the external connection 44, as shown in FIG. 12N. FIG. 12O shows an example manufactured wafer 42 of an optical module 27.

Figure 13:
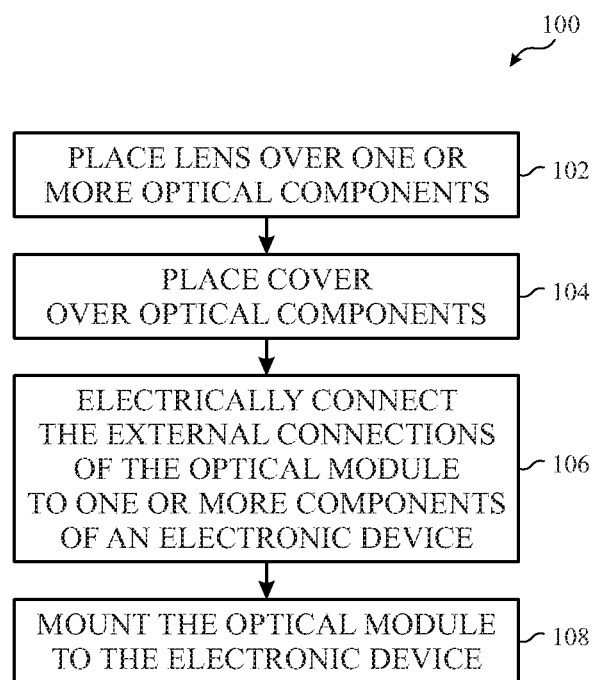
FIG. 13 is a flowchart of a process for incorporating an optical module in an electronic device, in accordance with an embodiment.

As stated above, the wafer 42 may also include a lens 64 and/or cover 66 when integrated into an electronic device 10. FIG. 13 is a flowchart 100 of an example process for creating an electronic device 10 with an optical module 27. A lens 64 may be placed over one or more optical components (process block 102). In some embodiments, some optical components may have a lens 64 or diffuser while others do not. For example, each light source (e.g., LED 38) may have a lens 64 while each photodiode 40 is unaided or vice versa. Additionally, a cover 66 may be placed over the optical components (process block 104). The cover 66 may provide structural, protective, and/or mounting support. The lens 64 and/or cover 66 may be affixed to the wafer 42 by any suitable means such as an adhesive, fasteners, and/or by being clamped.

When integrated into the electronic device 10, the external connections 44 of the optical module 27 may be electrically connected to one or more other components (e.g., processor core complex 18, power source 26, 110 ports 16, network interface 24, etc.) of the electronic device 10 (process block 106). The optical module 27 may also be mounted to the electronic device 10 (process block 108), for example, such that the optical components are in optical communication with the surroundings of the electronic device 10. As mentioned above, in one embodiment, the optical module may be integrated into a wearable device 10D (e.g., a watch, health sensor, etc.), and the optical module 27 may be mounted facing a user's skin. Other embodiments may include integration into various electronic devices 10 and/or be oriented towards the sky, a user's face, or other surrounding.

Although the above referenced flowcharts 70, 80, 100 and process of FIGS. 12A-12O are shown in a given order, in certain embodiments, the depicted steps may be reordered, altered, deleted, and/or occur simultaneously. For example, the bottom (e.g., non-active side) of the wafer 42 may be layered with RDLs 50 and PSVs 52 prior to the top (e.g., active side) of the wafer 42. Additionally, the referenced flowcharts 70, 80, 100 are given as illustrative tools, and further decision and/or process blocks may be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An optical wafer comprising:
a substrate;
one or more optical components encapsulated, at least partially, by the substrate, wherein each of the one or more optical components comprises an active side exposed on a first side of the substrate and configured to emit or sense light;
a passivation layer disposed on the first side of the substrate and over at least a portion of the active sides of the one or more optical components such that:
the active sides of the one or more optical components are exposed via a recess formed within the passivation layer; and
the passivation layer forms a sidewall of the recess configured to act as an optical barrier between the one or more optical components;
a dark photoresist layer, disposed on the passivation layer and the sidewall of the recess formed within the passivation layer, configured to reduce optical interference between the one or more optical components;
one or more printed circuit board (PCB) bars encapsulated, at least partially, by the substrate, wherein the one or more PCB bars are configured to allow electrical conductivity from the first side of the substrate to a second side of the substrate; and
at least one redistribution layer configured to electrically couple at least one of the one or more optical components to at least one of the one or more PCB bars.

2. The optical wafer of claim 1, wherein the one or more optical components comprises one or more light emitting diodes (LEDs), one or more photodiodes, or any combination thereof.

3. The optical wafer of claim 2, wherein the one or more LEDs comprises a plurality of LEDs and the one or more photodiodes comprises a plurality of photodiodes, wherein the plurality of photodiodes are arranged circumferentially around the plurality of LEDs.

4. The optical wafer of claim 1, comprising a plurality of passivation layers configured to provide electrical isolation between electrical connections within the optical wafer.

5. The optical wafer of claim 1, comprising a plurality of external electrical connections configured to couple the optical wafer to an electronic device.

6. The optical wafer of claim 5, wherein the external electrical connections comprise an under-bump metallization layer or a solder bump, or both.

7. The optical wafer of claim 5, comprising a cover configured to be integrated into an enclosure of the electronic device and configured to allow optical communication between the one or more optical components and an environment of the enclosure.

8. The optical wafer of claim 1, comprising a lens configured to focus light into or out of at least one of the one or more optical components.

9. The optical wafer of claim 8, wherein in the lens comprises a Fresnel lens.

10. The optical wafer of claim 1, wherein each of the one or more optical components is exposed via separate respective recesses formed in the passivation layer.

11. An optical module comprising:
a wafer comprising:
    a substrate having a first side and a second side;
    a plurality of optical components encapsulated, at least partially, by the substrate, wherein the plurality of optical components comprises one or more light sources and one or more light sensors, wherein each of the plurality of optical components comprises an active side exposed on the first side of the substrate;
    a passivation layer disposed on the first side of the substrate and over at least a portion of the active sides of the plurality of optical components such that:
        the active sides of the plurality of optical components are exposed via a recess formed within the passivation layer; and
        the passivation layer forms a sidewall of the recess configured to act as an optical barrier between the plurality of optical components; and
    a dark photoresist layer disposed on the passivation layer and the sidewall of the recess formed within the passivation layer that reduces optical interference between the plurality of optical components; and
a cover configured to protect the wafer from an environment.

12. The optical module of claim 11, wherein the wafer comprises one or more printed circuit board (PCB) bars configured to electrically couple an electrical contact of at least one of the plurality of optical components on the first side of the substrate to a communication contact on the second side of the substrate opposite the first side of the substrate.

13. The optical module of claim 11, wherein the cover is configured to secure the optical module to an electronic device and allow optical communication between the optical module and the environment outside of the electronic device.

14. The optical module of claim 11, wherein the cover comprises a lens configured to focus or diffuse light emitted from the one or more light sources or light received by the one or more light sensors.

15. The optical module of claim 11, wherein each of the plurality of optical components is exposed via separate respective recesses formed in the passivation layer.

16. A wearable device comprising:
an enclosure;
an optical module disposed in the enclosure, the optical module comprising:
    a wafer comprising a substrate;
    one or more optical components surrounded, at least partially, by the wafer, wherein each of the one or more optical components are configured to emit or sense light via an active side of the one or more optical components;
    one or more printed circuit board (PCB) bars surrounded, at least partially, by the wafer, wherein the one or more PCB bars are configured to electrically couple a contact of at least one of the one or more optical components to one or more contacts through the wafer;
    a passivation layer disposed on a first side of the substrate and over at least a portion of the active sides of the one or more optical components such that:
        the active sides of the one or more optical components are exposed via a recess formed within the passivation layer; and
        the passivation layer forms a sidewall of the recess configured to act as an optical barrier between the one or more optical components; and
    a dark photoresist layer disposed on the passivation layer and the sidewall of the recess formed within the passivation layer that reduces optical interference between the one or more optical components; and
a processor disposed within the enclosure, electrically coupled to the one or more optical components via the one or more contacts, and configured to communicate electrical signals with the one or more optical components.

17. The wearable device of claim 16, wherein the enclosure comprises a transparent portion configured to allow optical communication between the one or more optical components and an environment outside the enclosure.

18. The wearable device of claim 17, wherein the transparent portion of the enclosure is configured to rest against a user's skin when in operation.

19. The wearable device of claim 16, wherein the one or more optical components comprises one or more light sources and one or more light sensors, and wherein the one or more light sources are configured to illuminate a subject and the one or more light sensors are configured to sense a response to illumination.

20. The wearable device of claim 16, wherein the wearable device comprises a watch.

* * * * *